US010574930B2

(12) United States Patent
Kamashita et al.

(10) Patent No.: US 10,574,930 B2
(45) Date of Patent: Feb. 25, 2020

(54) IMAGE SENSOR AND ELECTRONIC CAMERA

(71) Applicant: NIKON CORPORATION, Tokyo (JP)

(72) Inventors: Atsushi Kamashita, Komae (JP); Atsushi Komai, Tokorozawa (JP); Toru Takagi, Fujisawa (JP); Tomohisa Ishida, Tokyo (JP)

(73) Assignee: NIKON CORPORATION, Tokyo (JP)

( * ) Notice: Subject to any disclaimer, the term of this patent is extended or adjusted under 35 U.S.C. 154(b) by 61 days.

(21) Appl. No.: 15/765,152

(22) PCT Filed: Sep. 27, 2016

(86) PCT No.: PCT/JP2016/078522
§ 371 (c)(1),
(2) Date: Mar. 30, 2018

(87) PCT Pub. No.: WO2017/057397
PCT Pub. Date: Apr. 6, 2017

(65) Prior Publication Data
US 2018/0324374 A1 Nov. 8, 2018

(30) Foreign Application Priority Data
Sep. 30, 2015 (JP) .................................. 2015-195281

(51) Int. Cl.
H04N 5/369 (2011.01)
H01L 27/12 (2006.01)
(Continued)

(52) U.S. Cl.
CPC .......... H04N 5/379 (2018.08); H01L 27/1203 (2013.01); H01L 27/14612 (2013.01);
(Continued)

(58) Field of Classification Search
CPC ................. H04N 5/361; H04N 5/3698; H04N 5/374–379; H01L 27/1203;
(Continued)

(56) References Cited

U.S. PATENT DOCUMENTS 9,270,906 B2 * 2/2016 Peng ....................... H04N 5/353
2007/0069258 A1 * 3/2007 Ahn ................... H01L 27/14634
257/290

(Continued)

FOREIGN PATENT DOCUMENTS

CN 1956490 A 5/2007
CN 103137640 A 6/2013
(Continued)

OTHER PUBLICATIONS

Jun. 25, 2019 partial European Search Report issued in European Patent Application No. 16851568.2.
(Continued)

Primary Examiner — Lin Ye
Assistant Examiner — Chriss S Yoder, III
(74) Attorney, Agent, or Firm — Oliff PLC

(57) ABSTRACT

An image sensor includes a first semiconductor layer provided with a pixel, including a photoelectric conversion unit that photoelectrically converts incident light to generate an electric charge, an accumulation unit that accumulates the electric charge generated by the photoelectric conversion unit, and a transfer unit that transfers the electric charge generated by the photoelectric conversion unit to the accumulation unit, a second semiconductor layer provided with a supply unit that supplies the transfer unit with a transfer signal for transferring the electric charge from the photoelectric conversion unit to the accumulation unit, and a third semiconductor layer into which a signal is inputted, the
(Continued)

signal being based on the electric charge that has been transferred to the accumulation unit.

15 Claims, 9 Drawing Sheets

(51) Int. Cl.
*H01L 27/146* (2006.01)
*H04N 5/374* (2011.01)

(52) U.S. Cl.
CPC ......... *H04N 5/374* (2013.01); *H01L 27/1464* (2013.01); *H01L 27/14621* (2013.01); *H01L 27/14627* (2013.01)

(58) Field of Classification Search
CPC ......... H01L 27/14612; H01L 27/14621; H01L 27/14627; H01L 27/14634; H01L 27/1464; H01L 27/14643; H01L 27/14665; H01L 27/1469
See application file for complete search history.

(56) References Cited

U.S. PATENT DOCUMENTS

| | | |
|---|---|---|
| 2007/0096238 A1 | 5/2007 | Oike et al. |
| 2009/0033781 A1 | 2/2009 | Okita et al. |
| 2010/0141816 A1 | 6/2010 | Maruyama et al. |
| 2010/0245647 A1 | 9/2010 | Honda et al. |
| 2011/0042723 A1 | 2/2011 | Mabuchi |
| 2012/0044398 A1 | 2/2012 | Chou et al. |
| 2013/0141617 A1 | 6/2013 | Soda |
| 2015/0172574 A1 | 6/2015 | Honda et al. |
| 2015/0189214 A1 | 7/2015 | Kurose |
| 2016/0088253 A1 | 3/2016 | Tezuka |

FOREIGN PATENT DOCUMENTS

| | | |
|---|---|---|
| CN | 104754253 A | 7/2015 |
| JP | 2007-151069 A | 6/2007 |
| JP | 2010-225927 A | 10/2010 |
| JP | 2012-147004 A | 8/2012 |
| JP | 2013-118345 A | 6/2013 |
| JP | 2015-126043 A | 7/2015 |
| KR | 101340112 B1 | 12/2013 |
| KR | 2015-0076065 A | 7/2015 |
| WO | 2014/196216 A1 | 12/2014 |

OTHER PUBLICATIONS

May 21, 2019 Japanese Office Action issued in Japanese Patent Application No. 2017-543450.
Nov. 8, 2016 International Search Report issued in Patent Application No. PCT/JP2016/078522.
Jul. 4, 2017 Office Action issued in Taiwanese Patent Application No. 105131631.
Aug. 9, 2019 Office Action issued in Korean Patent Application No. 2018-7008444.
Oct. 29, 2019 Search Report issued in European Patent Application No. 16851568.2.
Nov. 20, 2019 Office Action issued in Chinese Patent Application No. 201680056712.2.

\* cited by examiner

IMAGE SENSOR AND ELECTRONIC CAMERA

TECHNICAL FIELD

The present invention relates to an image sensor and an electronic camera.

BACKGROUND ART

An image sensor known in the art has stacked chips, one of the chips having pixels formed thereon and the other of the chips having a pixel driving circuit formed thereon for driving the pixels (e.g., PTL1). The conventional image sensor must be provided with two transfer pulse power supplies for each pixel in order to individually control exposure amounts for the pixels, which may present a problem.

CITATION LIST

Patent Literature

PTL1: Japanese Laid-Open Patent Publication No. 2010-225927

SUMMARY OF INVENTION

An image sensor according to the 1st aspect of the present invention comprises: a first semiconductor layer provided with a pixel, including a photoelectric conversion unit that photoelectrically converts incident light to generate an electric charge, an accumulation unit that accumulates the electric charge generated by the photoelectric conversion unit, and a transfer unit that transfers the electric charge generated by the photoelectric conversion unit to the accumulation unit; a second semiconductor layer provided with a supply unit that supplies the transfer unit with a transfer signal for transferring the electric charge from the photoelectric conversion unit to the accumulation unit; and a third semiconductor layer into which a signal is inputted, the signal being based on the electric charge that has been transferred to the accumulation unit.

An image sensor according to the 2nd aspect of the present invention comprises: a first semiconductor layer provided with a plurality of pixels, each pixel including a photoelectric conversion unit that photoelectrically converts incident light, an accumulation unit into which an electric charge as a result of photoelectric conversion by the photoelectric conversion unit is transferred and accumulated, and a transfer unit that transfers the electric charge generated by the photoelectric conversion unit to the accumulation unit, and a semiconductor layer that is arranged to be stacked on the first semiconductor substrate, in which a supply unit is provided for each of the plurality of pixels, the supply unit supplying the transfer unit with a transfer signal for transferring the electric charge from the photoelectric conversion unit to the accumulation unit.

An image sensor according to the 3rd aspect of the present invention comprises: a first semiconductor substrate having an insulating unit formed therein and having a preset predetermined substrate voltage, an photoelectric conversion unit that is provided in the first semiconductor substrate and photoelectrically converts incident light, a transfer unit that is provided in the first semiconductor substrate and transfers the electric charge as a result of photoelectric conversion by the photoelectric conversion unit to an accumulation unit based on the transfer signal, and a supply unit that is electrically insulated from the first semiconductor substrate by the insulating unit, the supply unit supplying the transfer unit with the transfer signal including a first positive signal voltage and a second negative signal voltage.

An electronic camera according to the 3rd aspect of the present invention comprises: the image sensor according to the 1st aspect or 2nd aspect.

DESCRIPTION OF EMBODIMENTS

First Embodiment

Figure 1:
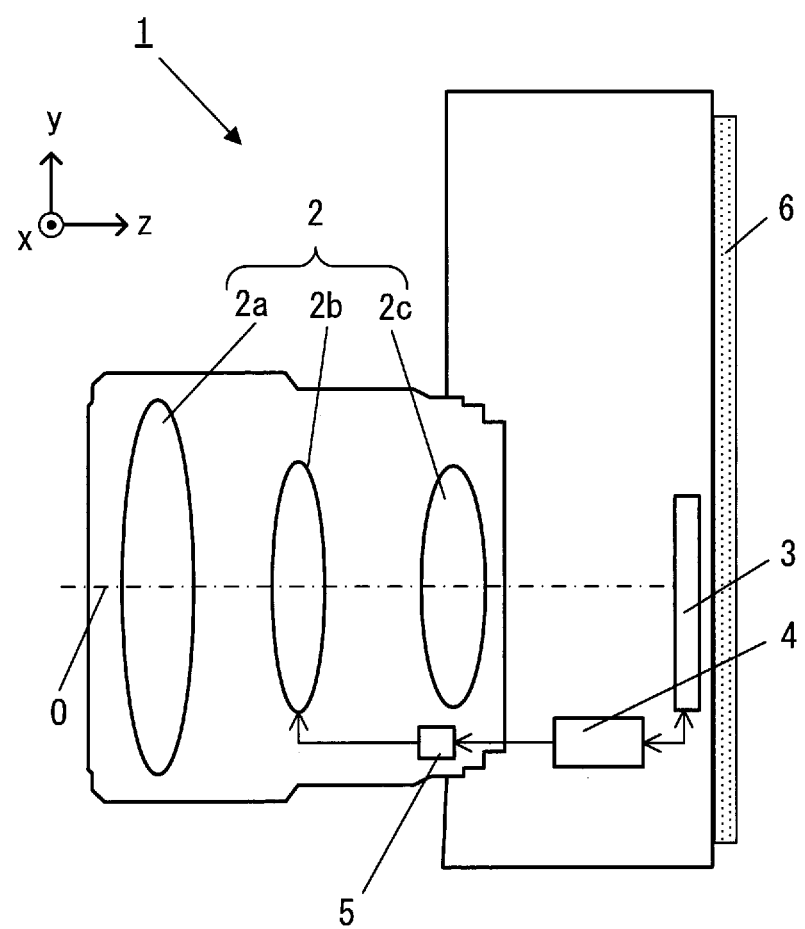
FIG. 1 is a cross-sectional view schematically illustrating a configuration of an image-capturing apparatus.

FIG. 1 is a cross-sectional view schematically illustrating a configuration of an image-capturing apparatus including an image sensor according to a first embodiment. The image-capturing apparatus 1 includes an image-capturing optical system 2, an image sensor 3, a control unit 4, a lens driving unit 5, and a display unit 6.

The image-capturing optical system 2 forms an object image on an image-capturing plane of the image sensor 3. The image-capturing optical system 2 includes a lens 2a, a focusing lens 2b, and a lens 2c. The focusing lens 2b is a lens for adjusting a focal point of the image-capturing optical system 2. The focusing lens 2b can be driven in an optical axis O direction.

The lens driving unit 5 has an actuator (not shown). Using the actuator, the lens driving unit 5 drives the focusing lens 2b in the optical axis O direction by a desired amount. The image sensor 3 captures the object image to output an image signal. The control unit 4 controls the image sensor 3 and other components. The control unit 4 performs image processing or other processing on an image signal outputted by the image sensor 3, and then records the processed image signal in a recording medium (not shown) or displays an image on the display unit 6. The display unit 6 is a display device having a display member such as a liquid crystal panel.

Figure 2:
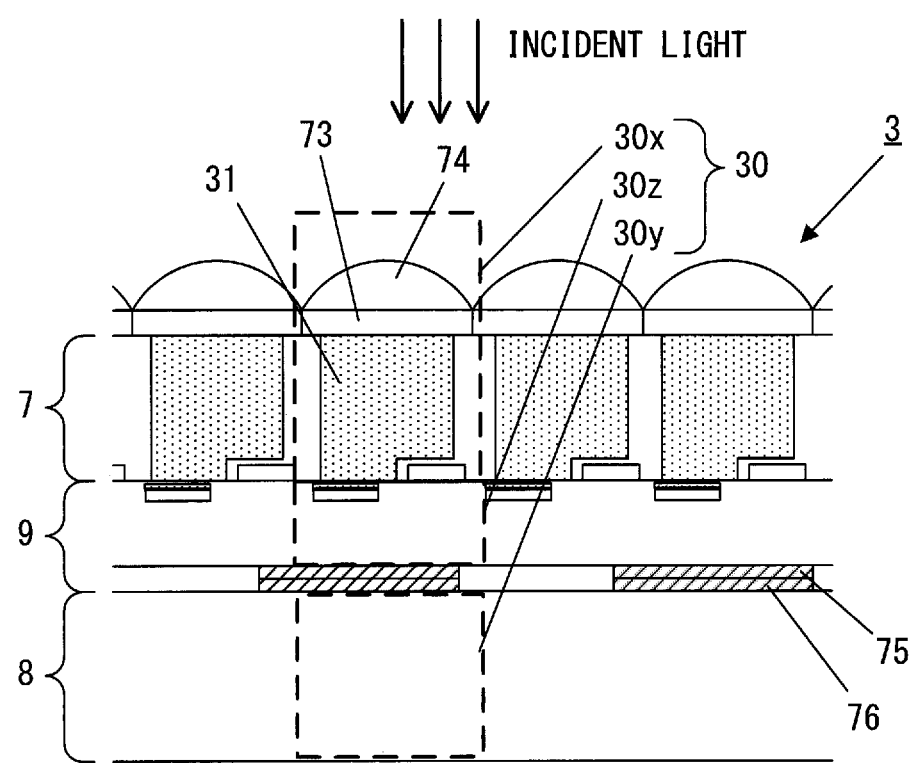
FIG. 2 is a cross-sectional view of an image sensor.

FIG. 2 is a cross-sectional view of the image sensor 3. It should be noted that FIG. 2 illustrates only a part of the entire image sensor 3 in cross section. The image sensor 3 is a so-called backside illumination image sensor. The image sensor 3 photoelectrically converts incident light that is incident from above in the figure. The image sensor 3 includes a first semiconductor substrate 7, a second semiconductor substrate 8, and an insulating unit 9. It should be noted that the first semiconductor substrate 7 and the second semiconductor substrate 8 are also referred to respectively as a first semiconductor layer and a second semiconductor layer.

The first semiconductor substrate 7 is a part of a Silicon on Insulator (SOI) substrate. The SOI substrate is a silicon substrate that has an embedded insulating layer formed therein. The first semiconductor substrate 7 is one of two silicon layers included in one SOI substrate, which are insulated (separated) by the embedded insulating layer. An insulating unit 9 is a layer provided between the first semiconductor substrate 7 and the second semiconductor substrate 8. The insulating unit 9 includes the embedded insulating layer included in the SOI substrate, and the other of the above-described two silicon layers (a silicon layer that does not belong to the first semiconductor substrate 7). In other words, the SOI substrate includes the silicon substrate, the embedded oxide layer, and the silicon layer.

The first semiconductor substrate 7 includes a photodiode 31, which is a pinned (embedded) photodiode, and a transfer transistor and a reset transistor. A surface of the first semiconductor substrate 7 on the insulating unit 9 side (i.e., a surface opposite to the incident light side) therefore has a conductivity type opposite to that of the first semiconductor substrate 71. For example, if the first semiconductor substrate 71 is an N-type semiconductor layer, a P-type semiconductor layer having a high concentration and a small thickness is arranged on the surface of the first semiconductor substrate 71 on the insulating unit 9 side. A ground voltage (GND) is applied to the first semiconductor substrate 7 as a substrate voltage. The photodiode 31 is arranged on the incident light side of the first semiconductor substrate 7, and the transfer transistor and the reset transistor are arranged on a surface on the second semiconductor substrate 8 side.

The second semiconductor substrate 8 has circuits arranged therein, the circuits operating with a voltage not less than the substrate voltage of the first semiconductor substrate 7 among a variety of circuits for reading signals from the photodiode 31. Specifically, an A/D conversion unit 302 (described later), a sampling unit 303, a pixel value saving unit 304, a calculation unit 305, and an individual pixel control unit 306, and a part of a pixel driving unit 307 (circuits that operate with a voltage not less than a substrate voltage of the first semiconductor substrate 7, that is, a first reset signal supply unit 307*b* and a capacitance expansion signal supply unit 307*d*) are arranged in the second semiconductor substrate 8. A ground voltage GND is applied to the second semiconductor substrate 8 as a substrate voltage.

The insulating unit 9 has circuits arranged therein, the circuits handling negative voltages among a variety of circuits for reading signals from the photodiode 31.

Specifically, a part of a pixel driving unit 307 described later (i.e., a transfer signal supply unit 307*a* and a second reset signal supply unit 307*c* that handle voltages lower than the substrate voltage of the first semiconductor substrate 7) is arranged in the insulating unit 9.

A plurality of photodiodes 31 are two-dimensionally arranged in the first semiconductor substrate 71. A plurality of color filters 73, each corresponding to its individual photodiode among a plurality of the photodiodes 31, are provided on the incident light side of the first semiconductor substrate 7. Different types of color filters 73 are available, which transmit different wavelength ranges corresponding to red (R), green (G), and blue (B), for example. Three types of color filters 73 corresponding to red (R), green (G), and blue (B), for example, are here arranged in a Bayer array.

A plurality of microlenses 74, each corresponding to its individual color filter among a plurality of the color filters 73, are provided on the incident light side of the color filter 73. The microlens 74 converges the incident light toward the corresponding photodiode 31. After having passed through the microlens 74, the incident light is filtered by the color filter 73 to transmit only a part of the wavelength range of the incident light. The filtered light is then incident on the photodiode 31. The photodiode 31 photoelectrically converts the incident light to generate an electric charge.

A plurality of bumps 75 are arranged on a surface of the insulating unit 9 opposite to the second semiconductor substrate 8. A plurality of bumps 76 corresponding to a plurality of the bumps 75 are arranged on a surface of the second semiconductor substrate 8 facing the insulating unit 9. A plurality of the bumps 75 and a plurality of the bumps 76 are bonded together. The insulating unit 9 and the second semiconductor substrate 8 are electrically connected via a plurality of the bumps 75 and a plurality of the bumps 76.

The image sensor 3 has a plurality of pixels 30. Details thereof will be described later. One pixel 30 includes a first pixel 30*x* provided in the first semiconductor substrate 7, a second pixel 30*y* provided in the second semiconductor substrate 8, and a third pixel 30*z* provided in the insulating unit 9. One first pixel 30*x* includes one microlens 74, one color filter 73, one photodiode 31, and other components. The first pixel 30*x* additionally includes a variety of circuits (described later) provided in the first semiconductor substrate 7. The second pixel 30*y* includes a variety of circuits (described later) provided in the second semiconductor substrate 8. The third pixel 30*z* includes a variety of circuits (described later) provided in the insulating unit 9.

Figure 3:
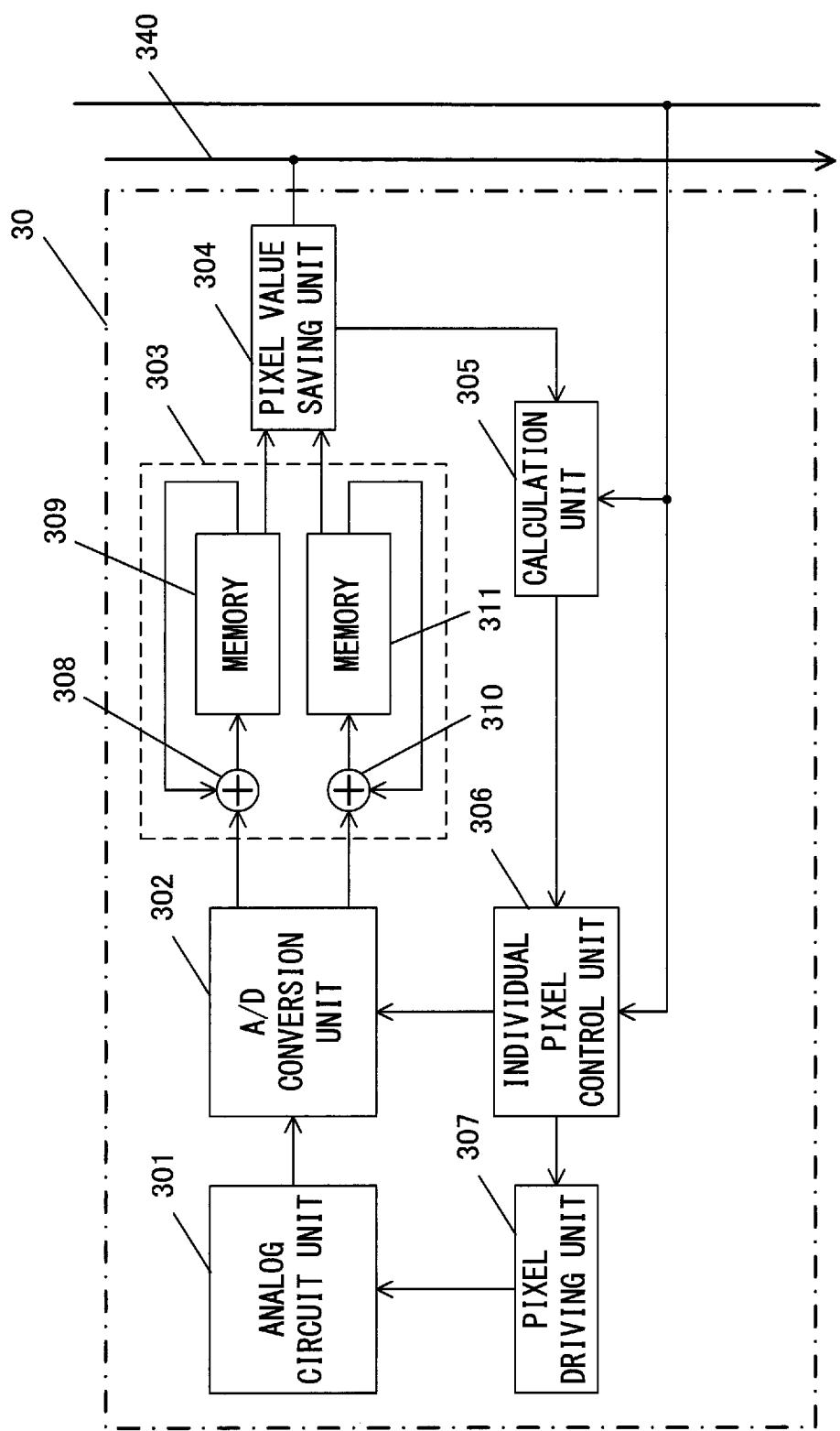
FIG. 3 is a block diagram schematically illustrating a configuration of a pixel.

FIG. 3 is a block diagram schematically illustrating a configuration of the pixel 30. The pixel 30 includes an analog circuit unit 301, an A/D conversion unit 302, a sampling unit 303, a pixel value saving unit 304, a pixel driving unit 307, an individual pixel control unit 306, and a calculation unit 305.

The analog circuit unit 301 photoelectrically converts incident light to output the resulting signal as an analog signal to the A/D conversion unit 302. The A/D conversion unit 302 samples the analog signal outputted by the analog circuit unit 301 to output a digital signal multiplied by a predetermined gain. The A/D conversion unit 302 repeatedly samples a pixel reset signal and a pixel signal and individually outputs a sampling result of the pixel reset signal and a sampling result of the pixel signal as digital signals.

The sampling unit 303 calculates and saves an integral value of the sampling result of the pixel reset signal and the sampling result of the pixel signal. The sampling unit 303 includes a first adder 308 and a first memory 309 for the pixel reset signal, and a second adder 310 and a second memory 311 for the pixel signal.

The sampling unit 303 adds the sampling result of the pixel reset signal outputted by the A/D conversion unit 302 and the integral value of previous sampling results saved in the first memory 309, by means of the first adder 308. The sampling unit 303 stores the resulting sum in the first memory 309. The sampling unit 303 updates the value stored in the first memory 309 every time a sampling result of the pixel reset signal is outputted by the A/D conversion unit 302.

The sampling unit 303 adds the sampling result of the pixel signal outputted by the A/D conversion unit 302 and the integral value of previous sampling results saved in the second memory 311, by means of the second adder 310. The sampling unit 303 stores the resulting sum in the second memory 311. The sampling unit 303 updates the value stored in the second memory 311 every time a sampling result of the pixel signal is outputted by the A/D conversion unit 302.

In this way, the A/D conversion unit 302 repeatedly samples the pixel reset signal and the pixel signal and the sampling unit 303 executes a process of integrating the sampling results. This process is a process known as a correlated multiple sampling.

Once a predetermined number of samplings, which has been determined by the individual pixel control unit 306, has been completed, the sampling unit 303 outputs a digital value to the pixel value saving unit 304, the digital value being based on the value stored in the first memory 309 and the value stored in the second memory 311. The pixel value saving unit 304 stores the digital value as a photoelectric conversion result in the pixel 30. The pixel value saving unit 304 is connected to a signal line 340. The digital value stored in the pixel value saving unit 304 is externally readable via the signal line 340.

The calculation unit 305 calculates the number of repetitions, an exposure time, a gain, and other parameters in the correlated multiple sampling process, based on an externally determined exposure time and the last photoelectric conversion result saved in the pixel value saving unit 304. The individual pixel control unit 306 outputs the number of repetitions and the gain calculated by the calculation unit 305 to the A/D conversion unit 302. The individual pixel control unit 306 outputs the exposure time and the gain calculated by the calculation unit 305 to the pixel driving unit 307. The pixel driving unit 307 outputs a variety of signals (described later) to the analog circuit unit 301. The signals drive the elements of the analog circuit unit 301.

Figure 4:
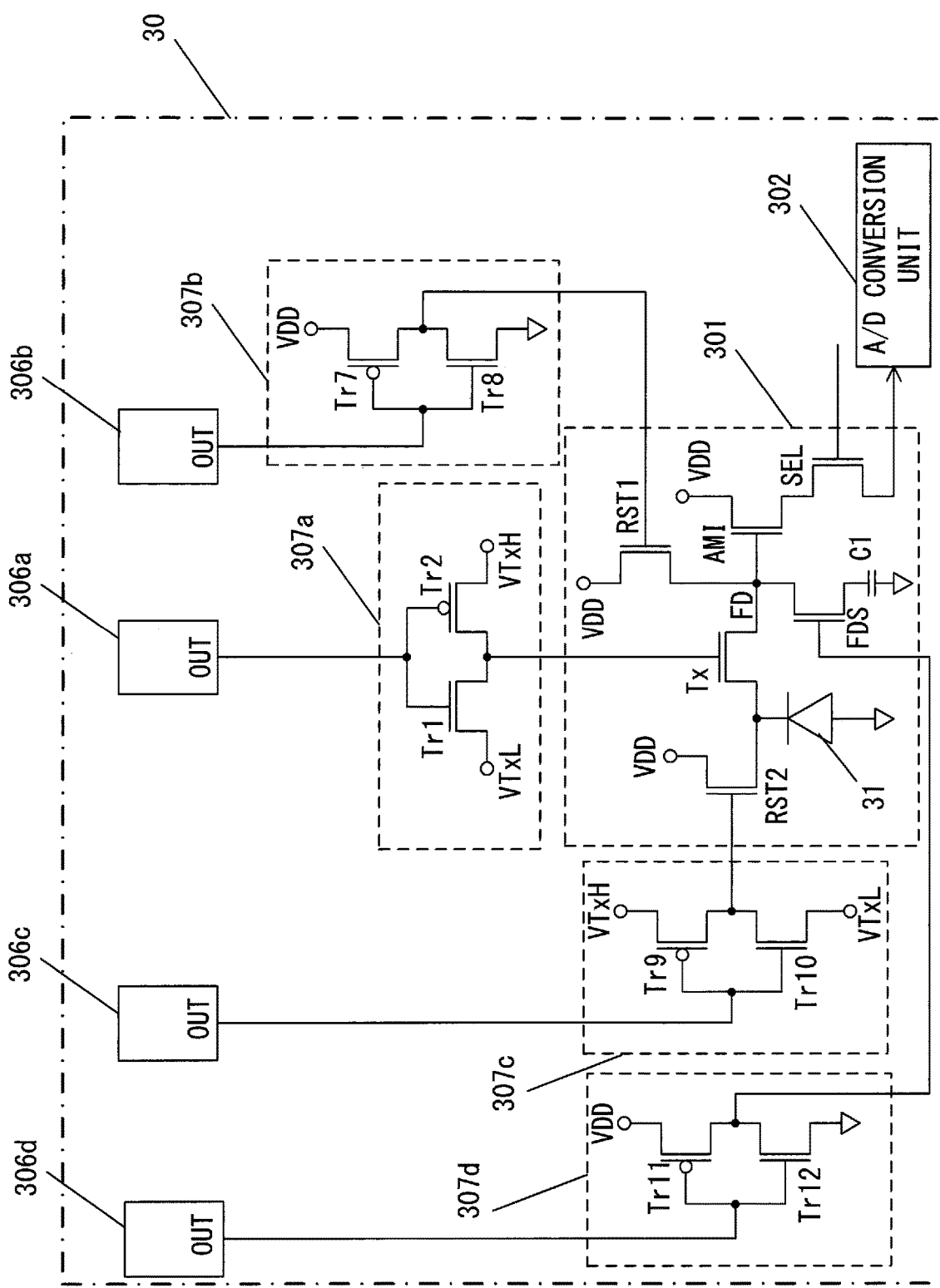
FIG. 4 is a circuit diagram of an analog circuit unit and a pixel driving unit.

FIG. 4 is a circuit diagram of the analog circuit unit 301, the individual pixel control unit 306, and the pixel driving unit 307. For the sake of convenience, FIG. 4 illustrates only parts of the individual pixel control unit 306 and the pixel driving unit 307. The parts of the individual pixel control unit 306 are denoted by reference numerals 306a, 306b, and so on and the parts of the pixel driving unit 307 are denoted by reference numerals 307a, 307b, and so on.

The analog circuit unit 301 includes a photodiode 31, a transfer transistor Tx, a floating diffusion FD, a first reset transistor RST1, a second reset transistor RST2, an amplification transistor AMI, a selection transistor SEL, a capacitance expansion transistor FDS, and a capacitor C1.

The photodiode 31 is a photoelectric conversion unit that photoelectrically converts incident light to generate an amount of electric charge depending on a light amount of the incident light. The transfer transistor Tx is a transfer unit that transfers the electric charge generated by the photodiode 31 to the floating diffusion FD in response to a transfer signal supplied from a transfer signal supply unit 307a (described later). The floating diffusion FD is an accumulation unit that accumulates the electric charge transferred by the transfer transistor Tx. The amplification transistor AMI outputs a signal depending on an amount of the electric charge accumulated in the floating diffusion FD. When the selection transistor SEL is on, the signal outputted by the amplification transistor AMI is inputted to the A/D conversion unit 302.

The analog circuit unit 301 includes two reset transistors: a first reset transistor RST1 and a second reset transistor RST2. When the floating diffusion FD is reset, the first reset transistor RST1 is supplied with a first reset signal from a first reset signal supply unit 307b (described later). The first reset signal supply unit 307b (described later) supplies a signal representing the voltage VDD as the first reset signal.

The first reset transistor RST1 resets the floating diffusion FD in response to the first reset signal. When the photodiode 31 is reset, the second reset transistor RST2 is supplied with a second reset signal from a second reset signal supply unit 307c (described later). The second reset signal supply unit 307c (described later) supplies a signal representing the voltage VDD as the second reset signal. The second reset transistor RST2 resets the photodiode 31 in response to the second reset signal.

The capacitance expansion transistor FDS switches a connection between the floating diffusion FD and the capacitor C1 in response to a capacitance expansion signal supplied from a capacitance expansion signal supply unit 307d (described later). For example, if an incident light amount to the photodiode 31 is large and the floating diffusion FD could be saturated, the capacitance expansion transistor FDS is turned on to connect the floating diffusion FD and the capacitor C1. This substantially increases the capacitance of the floating diffusion FD by an amount equal to the capacitance of the capacitor C1, which allows the floating diffusion FD to handle a larger light amount.

The first reset signal supply unit 307b is a CMOS circuit including a pMOS transistor Tr7 and an nMOS transistor Tr8. Based on an output signal of a first reset control unit 306b, the first reset signal supply unit 307b supplies a gate of the first reset transistor RST1 with either the voltage VDD (a predetermined power supply voltage; the same applies hereinafter) or the voltage GND as the first reset signal. As described above, the first reset control unit 306b is a part of the individual pixel control unit 306 and the first reset signal supply unit 307b is a part of the pixel driving unit 307. It should be noted that, for an overdrive, the first reset control unit 306b supplies the gate of the first reset transistor RST1 with a voltage VRST1H higher than the voltage VDD, instead of the voltage VDD.

The capacity expansion signal supply unit 307d is a CMOS circuit including a pMOS transistor Tr11 and an nMOS transistor Tr12. Based on an output signal of a capacitance expansion control unit 306d, the capacitance expansion signal supply unit 307d supplies a gate of the capacitance expansion transistor FDS with either the voltage VDD or the voltage GND as the capacitance expansion signal. As described above, the capacity expansion control unit 306d is a part of the individual pixel control unit 306 and the capacity expansion signal supply unit 307d is a part of the pixel driving unit 307. It should be noted that, for an overdrive, the capacity expansion signal supply unit 307d supplies the gate of the capacity expansion transistor FDS with a voltage VFDSH higher than the voltage VDD, instead of the voltage VDD.

The transfer signal supply unit 307a is a CMOS circuit including a pMOS transistor Tr2 and an nMOS transistor Tr1. The transfer signal supply unit 307a supplies a gate of the transfer transistor Tx with either a voltage VTxH supplied from the first power supply unit or a voltage VTxL supplied from the second power supply unit as a transfer signal, based on an output signal of the transfer control unit 306a. The voltage VTxH supplied by the first power supply unit is higher than the ground voltage which is the substrate voltage of the first semiconductor substrate 7 (i.e., the voltage VTxH is a positive voltage), while the voltage VTxL supplied by the second power supply unit is lower than the ground voltage which is the substrate voltage of the first semiconductor substrate 7 (i.e., the voltage VTxL is a negative voltage). As described above, the transfer control unit 306a is a part of the individual pixel control unit 306 and the transfer signal supply unit 307a is a part of the pixel driving unit 307.

While the first reset signal and the second reset signal described above are either the voltage VDD or the ground voltage, the transfer signal outputted by the transfer signal supply unit 307a is either the voltage VTxH or the voltage VTxL. The voltage VTxH is higher than the ground voltage which is the substrate voltage of the first semiconductor substrate 7 (i.e., the voltage VTxH is a positive voltage), while the voltage VTxL is lower than the ground voltage which is the substrate voltage of the first semiconductor substrate 7 (i.e., the voltage VTxL is a negative voltage). It should be noted that both the VTxH and the voltage VDD are herein positive voltages and may be the same or different.

The output signal of the transfer control unit 306a is either the voltage VDD and the ground voltage GND. If the transfer control unit 306a outputs the voltage VDD, the nMOS transistor Tr1 is turned on to supply a gate of the transfer transistor Tx with the voltage VTxL. If the transfer control unit 306a outputs the voltage VDD, the pMOS transistor Tr1 is turned off. If the transfer control unit 306a outputs the ground voltage, the nMOS transistor Tr1 is turned off. If the transfer control unit 306a outputs the ground voltage, the pMOS transistor Tr1 is turned on and supplies the gate of the transistor Tx with the voltage VTxH. In other words, the transfer signal supply unit 307a converts a signal including the voltage VDD and the ground voltage, which is supplied from the transfer control unit 306a, into a signal including the voltage VTxH and the voltage VTxL to supply it to the gate of the transfer transistor Tx. The voltage VTxH is higher than the ground voltage which is the substrate voltage of the first semiconductor substrate 7 (i.e., the voltage VTxH is a positive voltage), while the voltage VTxL is lower than the ground voltage which is the substrate voltage of the first semiconductor substrate 7 (i.e., the voltage VTxL is a negative voltage). It should be noted that a threshold voltage Vth of the nMOS transistor Tr1 is set to a relatively high voltage so that no drain-source leakage current occurs even when the transfer control unit 306a supplies the ground voltage. For example, if the VTxL is −2V, a voltage of 2V is applied between the gate and source of the nMOS transistor trl when the transfer control unit 306a supplies the ground voltage. The threshold voltage Vth of the nMOS transistor Tr1 is set to approximately 3 to 4 V, for example, so that no current flows between the drain and the source even if a voltage of 2V is applied between the gate and the source.

If the transfer signal represents the voltage VTxH, the transfer transistor Tx transfers the electric charge generated by the photodiode 31 to the floating diffusion FD. If the transfer signal represents the voltage VTxL, the transfer transistor Tx does not transfer the electric charge generated by the photodiode 31 to the floating diffusion FD. It should be noted that the voltage VTxL lower than the substrate voltage of the first semiconductor substrate 7 is applied to the gate of the transfer transistor Tx in order to prevent the electric charge from being transferred from the photodiode 31 to the floating diffusion FD when the transfer transistor Tx is off.

The second reset signal supply unit 307c is a CMOS circuit including a pMOS transistor Tr9 and an nMOS transistor Tr10. Based on an output signal of a second reset control unit 306b, the second reset signal supply unit 307b supplies a gate of the second reset transistor RST2 with either the voltage VTxH or the voltage VTxL as the second reset signal. The configuration of the second reset signal supply unit 307c is the same as that of the transfer signal supply unit 307a and the description thereof will thus be omitted. As described above, the second reset control unit 306c is a part of the individual pixel control unit 306 and the second reset signal supply unit 307c is a part of the pixel driving unit 307.

Figure 5:
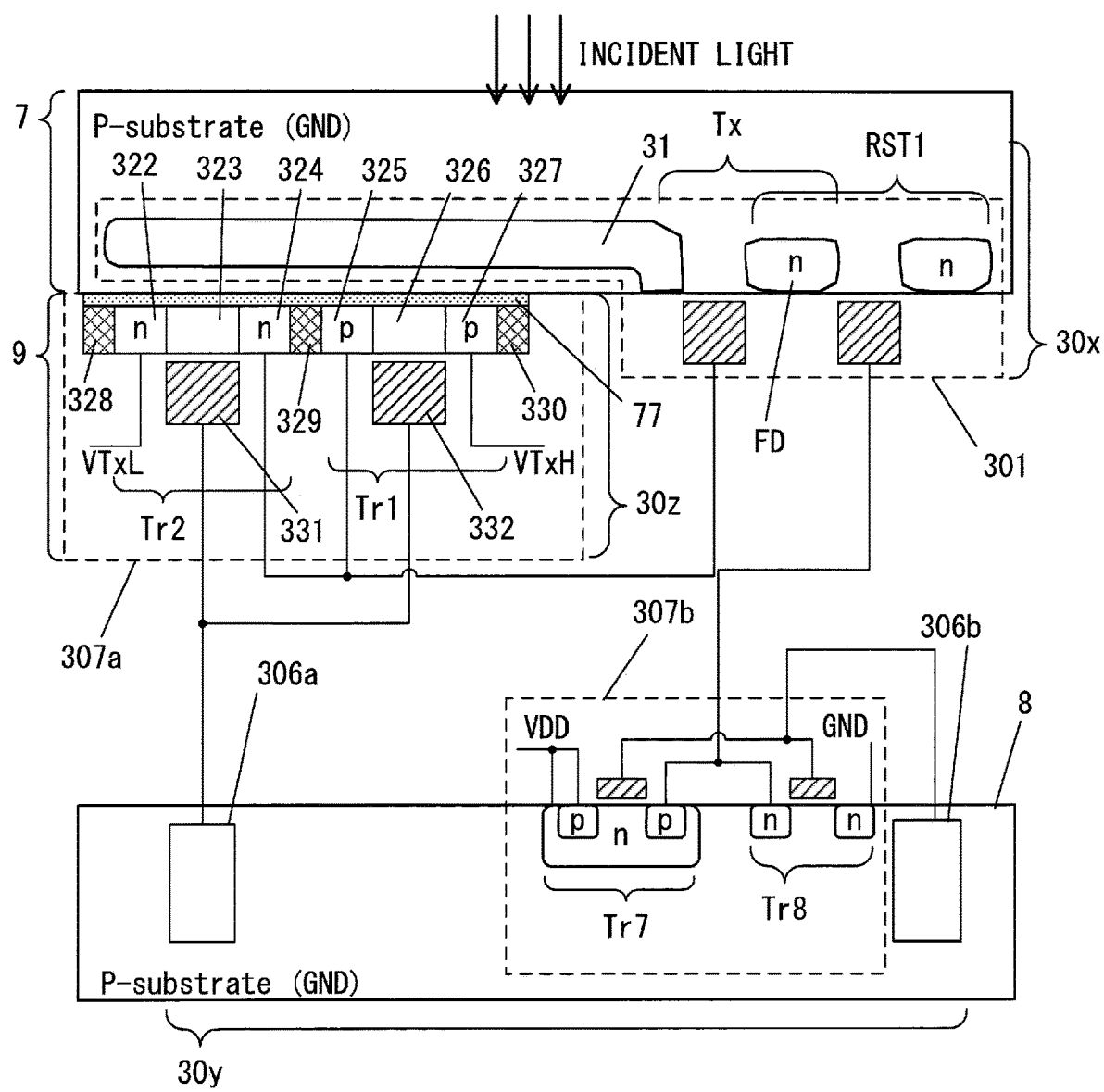
FIG. 5 is a view schematically illustrating a well structure of a first semiconductor substrate and a second semiconductor substrate.

FIG. 5 is a view schematically illustrating a well structure of the first semiconductor substrate 7 and the second semiconductor substrate 8. Incident light is incident onto the first semiconductor substrate 7 from above in the figure. The first semiconductor substrate 7 is a P-type semiconductor substrate having a SOI structure. The substrate voltage of the first semiconductor substrate 7 is set to the ground voltage GND. The second semiconductor substrate 8 is a P-type semiconductor substrate, not having the SOI structure. The substrate voltage of the second semiconductor substrate 8 is set to the ground voltage GND.

A surface of the first semiconductor substrate 7 opposite to the second semiconductor substrate 8 is provided with an embedded insulating layer 77. The embedded insulating layer 77 is an insulating layer embedded in the silicon substrate. A transfer signal supply unit 307a is formed on the embedded insulating layer 77. In other words, a CMOS circuit including the pMOS transistor Tr2 and nMOS transistor Tr1 is formed on the embedded insulating layer 77.

The pMOS transistor Tr2 includes a p-type region 325, a n-type region 326, a p-type region 327, and a gate electrode 332. The p-type region 325 and the p-type region 327 are drain-source regions which are formed by ion implantation of a high concentration of impurities into the silicon layer formed on the embedded insulating layer 77. The n-type region 326 is a channel region, which is formed by ion implantation of impurities into the silicon layer formed on the embedded insulating layer 77 to set the predetermined voltage Vth.

The nMOS transistor Tr1 includes an n-type region 322, a p-type region 323, an n-type region 324, and a gate electrode 331. The n-type region 322 and the n-type region 324 are drain-source regions which are formed by ion implantation of a high concentration of impurities into the silicon layer formed on the embedded insulating layer 77. The p-type region 323 is a channel region, which is formed by ion implantation of impurities into the silicon layer formed on the embedded insulating layer 77 to set the predetermined voltage Vth.

The pMOS transistor Tr2 and the nMOS transistor Tr1 are separated from other circuit elements with field isolation structures 328, 329, 330 by STI (Shallow Trench Isolation).

The p-type region 327 of the pMOS transistor Tr2 is connected to a power supply unit (not shown). The power supply unit supplies the voltage VTxH (i.e., a voltage higher than the substrate voltage of the first semiconductor substrate 7) to the p-type region 327 of the pMOS transistor Tr2 included in each pixel 30. The n-type region 322 of the nMOS transistor Tr1 is connected to a power supply unit (not shown). The power supply unit supplies the voltage VTxL (i.e., a voltage lower than the substrate voltage of the first semiconductor substrate 7) to the n-type region 322 of the nMOS transistor Tr1 included in all pixels 30.

The transfer signal supply unit 307a is connected to a gate electrode of the transfer transistor Tx. The transfer signal supply unit 307a is electrically insulated from other elements provided in the first semiconductor substrate 7.

The embedded insulating layer 77 in this embodiment is located only in a region where the transfer signal supply unit 307a is provided, among the entire first semiconductor substrate 7. The first semiconductor substrate 7 is manufactured from a wafer having a SOI structure (i.e., having the embedded insulating layer 77 embedded over its entire surface). In manufacturing the first semiconductor substrate 7, a part of the embedded insulating layer 77 that is located in regions different from the region where the transfer signal supply unit 307a is provided, and a silicon layer formed on the embedded insulating layer 77 are removed.

In a region where the embedded insulating layer 77 is absent (removed) among the entire first semiconductor substrate 7, an analog circuit unit 301 illustrated in FIG. 4 is arranged. Due to limitations of space, FIG. 5 illustrates only the photodiode 31, the transfer transistor Tx, the first reset transistor RST1, and a floating diffusion FD, among elements constituting the analog circuit unit 301.

The photodiode 31 photoelectrically converts incident light that is incident from above in the figure. In this embodiment, a part of the photodiode 31 is located below the embedded insulating layer 77 as illustrated in FIG. 5. In other words, a part of the photodiode 31 faces a part of the transfer signal supply unit 307a via the embedded insulating layer 77. This enables the photodiode 31 to receive a wider range of incident light. A silicon layer below the embedded insulating layer 77 serves as a supporting substrate for the pMOS transistor Tr2 and the nMOS transistor Tr1 which are formed in the embedded insulating layer 77. In other words, the silicon layer below the embedded insulating layer 77 is independent of electric operation of the pMOS transistor Tr2 and the nMOS transistor Tr1 on the embedded insulating layer 77. In this embodiment, the photodiode 31 is thus extended to the region below the embedded insulating layer 77 to form a larger opening of the photodiode 31.

It should be noted that a gradient of impurity concentration is provided in the photodiode 31 and a region closer to the transfer transistor Tx has a larger impurity concentration. This enables the transfer transistor Tx to reliably transfer the electric charge in the photodiode 31. The photodiode 31 is formed in the first semiconductor substrate 7 by ion implantation before the transfer signal supply unit 307a is formed, for example.

Among the units illustrated in FIG. 4, the transfer control unit 306a, the first reset control unit 306b, and the first reset signal supply unit 307b are arranged in the second semiconductor substrate 8. Although not illustrated in FIG. 5, other components are also arranged in the second semiconductor substrate 8.

Figure 6:
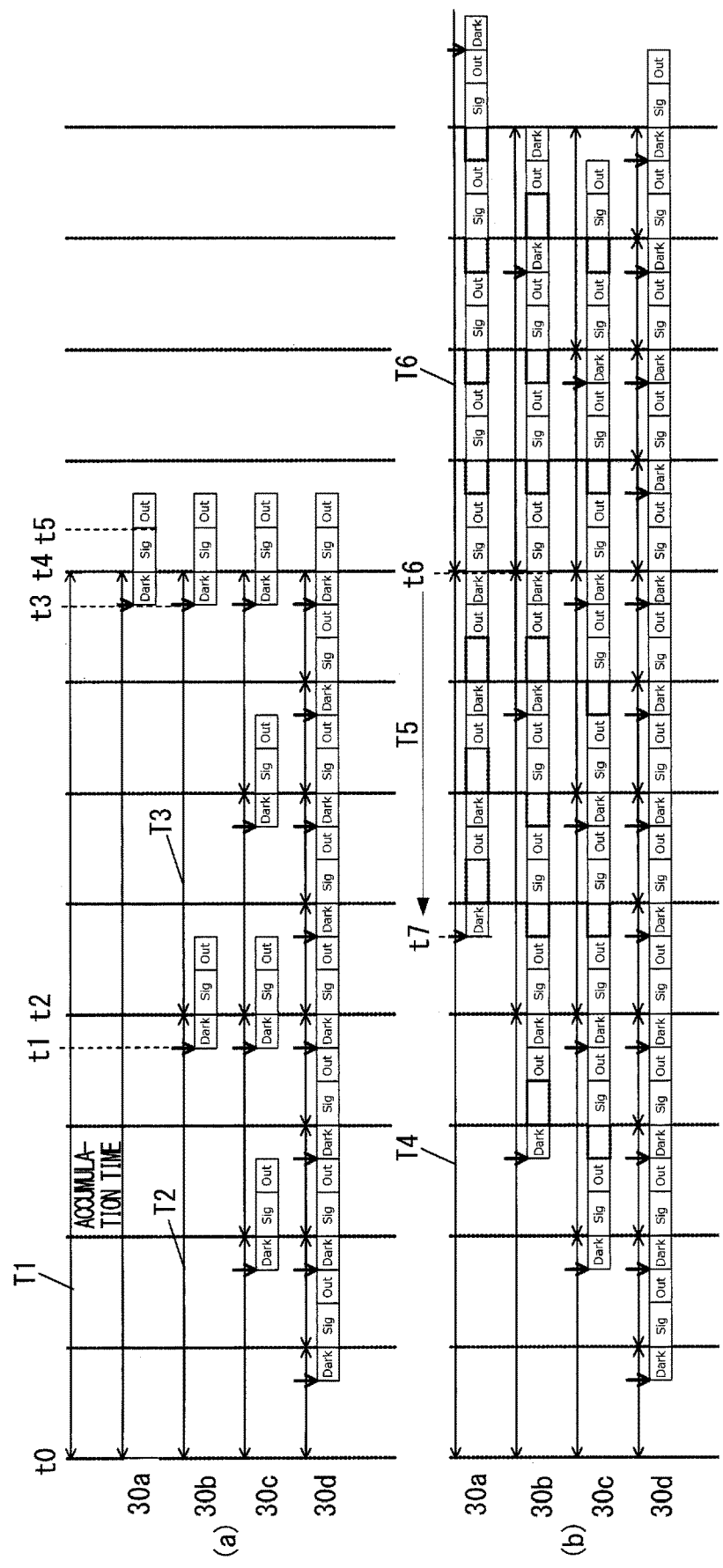
FIG. 6 is a timing chart illustrating an image-capturing sequence using the image sensor.

FIG. 6 is a timing chart illustrating an image-capturing sequence using the image sensor 3. The image sensor 3 can selectively perform multiple exposure and the correlated multiple sampling. First, a multiple exposure control will be described with reference to FIG. 6(a).

FIG. 6(a) is a timing chart in the multiple exposure for each pixel 30. The horizontal axis in FIG. 6(a) denotes time, and time proceeds to right. Rectangles marked as "Dark" in FIG. 6(a) indicate timings at which the A/D conversion unit 302 samples the pixel reset signals. Rectangles marked as "Sig" in FIG. 6(a) indicate timings at which the A/D conversion unit 302 samples the pixel signals. Rectangles marked as "Out" in FIG. 6(a) indicate timings at which the pixel value saving unit 304 outputs the digital value (the photoelectric conversion result) stored therein to peripheral circuits via the signal line 340. In FIG. 6(a), in performing the multiple exposure, the pixels 30 are classified into four pixels 30a to 30d depending on an amount of the incident light.

An operation of resetting the photodiode 31 and the floating diffusion FD at a start time t0 of an exposure period T1 is the same for all pixels 30. In the pixel 30a that receives an extremely small amount of incident light, the floating diffusion FD is then reset at a time t3 to sample the pixel reset signal. The time t3 is a time obtained by subtracting a time required for resetting the floating diffusion FD and sampling the pixel reset signal from an end time t4 of the exposure period T1. At the end time t4 of the exposure period T1, the electric charge that has been generated in a period from the time t0 to the time t4 and accumulated in the photodiode 31 is transferred to the floating diffusion FD to sample the pixel signal. Then, at a time t5, the photoelectric conversion result is stored in the pixel value saving unit 304.

In the pixel 30b that receives a slightly small amount of incident light, the externally determined exposure period Ti is equally divided into two periods T2 and T3 to perform the above-described operation twice. Specifically, at the times t1 and t3, the floating diffusion FD is reset to sample the pixel reset signal. The time t1 is a time obtained by subtracting a time required for resetting the floating diffusion FD and sampling the pixel reset signal from an end time t2 of the period T2. Then, at the time t2, the electric charge accumulated in the photodiode 31 is transferred to the floating diffusion FD to sample the pixel signal. The operation during a period from the time 3 to the time t5 is the same as in the case of the pixel 30a.

In the pixel 30c that receives a slightly large amount of incident light, the externally determined exposure period T1 is equally divided into four periods to perform the above-described operation four times. In the pixel 30d that receives an extremely large amount of incident light, the externally determined exposure period T1 is equally divided into eight periods to perform the above-described operation eight times.

In this way, the multiple exposure control enables the exposure time to individually vary for the pixels 30 receiving a large amount of incident light and the pixels 30 receiving a small amount of incident light in order to capture an image. Subdividing the exposure time and repeating the image-capturing allow a dynamic range to be extended, even if the incident light amount is so large that the floating diffusion FD would be saturated in a common image-capturing.

Next, the correlated multiplex sampling control will be described with reference to FIG. 6(b). FIG. 6(b) is a timing chart in the correlation multiple sampling control for each pixel 30. The horizontal axis in FIG. 6(b) denotes time, and time proceeds to right. Rectangles marked as "Dark" in FIG. 6(b) indicate timings at which the A/D conversion unit 302 samples the pixel reset signals. Rectangles marked as "Sig" in FIG. 6(b) indicate timings at which the A/D conversion unit 302 samples the pixel signals. Rectangles marked as "Out" in FIG. 6(b) indicate timings at which the A/D conversion unit 302 outputs the sampling results to the sampling unit 303. In FIG. 6(b), in performing the correlation multiple sampling, the pixels 30 are classified into four pixels 30a to 30d depending on an amount of the incident light.

The pixel 30a has the longest exposure time and the pixel 30d has the shortest exposure time. In the correlated multiple sampling control, the floating diffusion FD is reset at an earlier time as the pixel 30 has a longer exposure time. It thus takes a longer time until the pixel signal is sampled after resetting the floating diffusion FD, as the pixel 30 has a longer exposure time. During that period, the pixel reset signal is repeatedly sampled.

For example, in FIG. 6(b), the pixel 30a has the longest exposure time. The floating diffusion FD is reset at a time t7 that is earlier than an end time t6 of an exposure time T4 of the pixel 30a by a period T5. As a result, the pixel reset signal is sampled four times before the time t6. The pixel signal is then repeatedly sampled during a period from the end of the exposure time T4 to the end of the next exposure time T6.

A long exposure time translates into a small amount of the incident light and thus a large influence of noises on the pixel signal caused by the amplification transistor AMI, the selection transistor SEL, and the A/D conversion unit 302. In other words, the number of samplings of the pixel reset signal and the pixel signal to be performed is larger for a pixel 30 influenced to a greater extent by the noises described above, which enables a more sensitive image-capturing to be performed.

The image sensor 3 performs the above-described operations on all the pixels 30 in parallel. In other words, the pixels 30 perform in parallel the operations from the photoelectric conversion in the photodiode 31 to the storage of the digital value into the pixel value saving unit 304. The image-capturing results are sequentially read out from the pixel value saving unit 304 from one pixel 30 to another.

In this way, the image sensor 3 in the present embodiment can control the exposure time for each pixel. In order to control the exposure time for each pixel, the timing of turning on and off the transfer transistor Tx must be controlled for each pixel. In other words, the voltage (in the present embodiment, the voltage VTxH and the voltage VTxL) to be supplied to the gate of the transfer transistor Tx must be controlled for each pixel. Accordingly, the supply unit for supplying the gate of the transfer transistor Tx with the voltages VTxH and VTxL must be provided for each pixel. Since the voltage handled by the first semiconductor substrate 7 is different from the voltage VTxH and the voltage VTxL, the supply units handling the voltages VTxH and VTxL would occupy a large area if they would be provided in the pixel 30. As a result, an area occupied by the photodiode 31 in the pixel 30 would be substantially reduced. This causes a substantially reduced fill factor of the photodiode 31. In the present embodiment, providing the transfer signal supply unit 307a in the insulating unit 9 allows the exposure time to be controlled for each pixel, without providing the supply unit handling the voltages VTxH and VTxL in the vicinity of the photodiode 31 of the first semiconductor substrate 7, i.e., without decreasing the fill factor of the photodiode 31.

According to the above-described embodiment, the following operational advantages can be obtained.

(1) Each of a plurality of the pixels 30 provided in the first semiconductor substrate 7 has the transfer transistor Tx into which the transfer signal is inputted, wherein the transfer signal has the high voltage VTxH higher than the ground voltage, which is the substrate voltage of the first semiconductor substrate 7, and the low voltage VTxL lower than the ground voltage, which is the substrate voltage of the first semiconductor substrate 7. The A/D conversion unit 302 and the sampling unit 303 provided in the second semiconductor substrate 8 output the digital signal based on the amount of charge accumulated in the floating diffusion FD. In the insulating unit 9 provided between the first semiconductor substrate 7 and the second semiconductor substrate 8, the transfer signal supply unit 307a for transferring the transfer transistor Tx with the transfer signal is provided for each of a plurality of the pixels 30. This enables the transfer transistor Tx to be reliably turned off and thus prevents an increase in the dark current, without reducing the area of the photodiode 31. Further, since no circuit handling a negative power supply is provided in the first semiconductor substrate 7, there is no need to provide a diffusion layer or another layer that handles the negative power supply in the first semiconductor substrate 7, which can improve the fill factor of the photodiode 31. The same effect can be obtained also for the second reset transistor RST2.

(2) Some of a plurality of the transfer signal supply units 307a transfer the electric charge generated by the photodiodes 31 during the first period to the floating diffusions FD. Others of the transfer signal supply units 307a transfer the electric charge generated by the photodiodes 31 during the second period to the floating diffusions FD, the second period having a length different from that of the first period. This enables the exposure time to individually vary for different pixels 30, which results in an extended dynamic range of the image sensor 3.

(3) The photodiode 31 photoelectrically converts the incident light which is incident onto one surface of the first semiconductor substrate 7. The insulating unit 9 is provided facing the other surface of the first semiconductor substrate 7. This can increase the photoelectric conversion efficiency of the photodiode 31.

(4) The transfer signal supply unit 307a has the p-type region 327 that receives the voltage VTxH from the power supply unit providing a voltage higher than the substrate voltage of the first semiconductor substrate 7 and the n-type region 322 that receives the voltage VTxL from the power supply unit providing a voltage lower than the substrate voltage of the first semiconductor substrate 7. The transfer signal supply unit 307a inputs the voltage VTxH received from the former power supply unit and the voltage VTxL received from the latter power supply unit, as the transfer signal, to the transfer transistor Tx. In this way, the transfer signal supply unit 307a can handle a signal having a voltage different from that of each circuit arranged in the first semiconductor substrate 7 and the second semiconductor substrate 8. The same effect can be obtained also for the second reset signal supply unit 307c.

(5) A part of the photodiode 31 faces a part of the transfer transistor Tx via the embedded insulating layer 77. This can make the area of the photodiode 31 larger to effectively utilize the incident light.

(6) The first semiconductor substrate 7 has the embedded insulating layer 77 formed therein and has a substrate voltage set to the ground voltage. The first semiconductor substrate 7 is provided with the photodiode 31 that photoelectrically converts the incident light; the transfer transistor Tx that transfers the electric charge as a result of photoelectric conversion by the photodiode 31 to the floating diffusion FD, based on the transfer signal; and the transfer signal supply unit 307a that is electrically insulated from the first semiconductor substrate 7 by the embedded insulating layer 77, the transfer signal supply unit 307a supplying the transfer transistor Tx with the transfer signal having a voltage corresponding to the voltage VTxH, which is higher than the substrate voltage of the first semiconductor substrate 7, and a voltage corresponding to the voltage VTxL, which is lower than the substrate voltage of the first semiconductor substrate 7. This enables the transfer transistor Tx to be reliably turned off and thus prevents an increase in the dark current. The same effect can be obtained also for the second reset transistor RST2.

Second Embodiment

The image sensor 3 according to the first embodiment includes the semiconductor substrate having the SOI structure. The image sensor 3 according to a second embodiment is different from the image sensor 3 according to the first embodiment in that the image sensor 3 according to a second embodiment includes a semiconductor substrate having a common structure, instead of the SOI structure, and the transfer signal supply unit 307a is configured by a thin-film transistor. The following description describes the image sensor 3 according to the second embodiment and mainly differences from the image sensor 3 according to the first embodiment. The same components as those in the first embodiment are denoted by the same reference numerals and the description thereof will be omitted herein.

Figure 7:
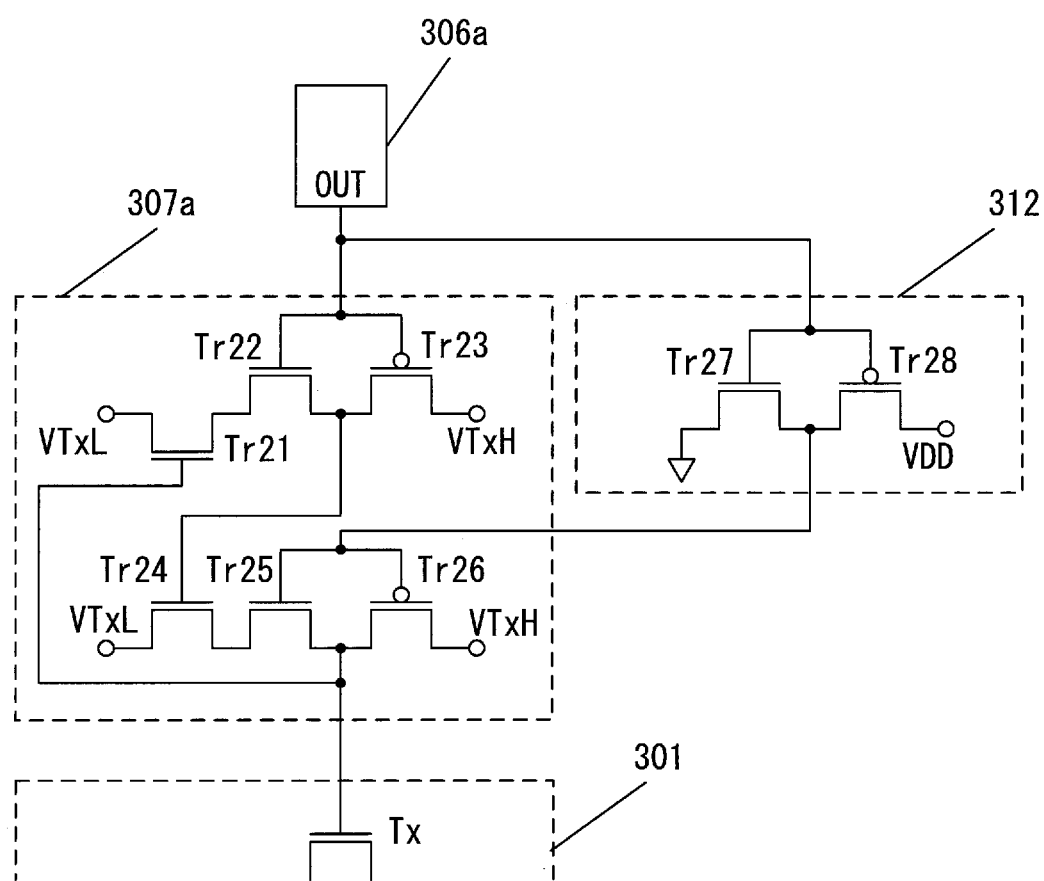
FIG. 7 is a circuit diagram of a transfer signal supply unit.
Figure 8:
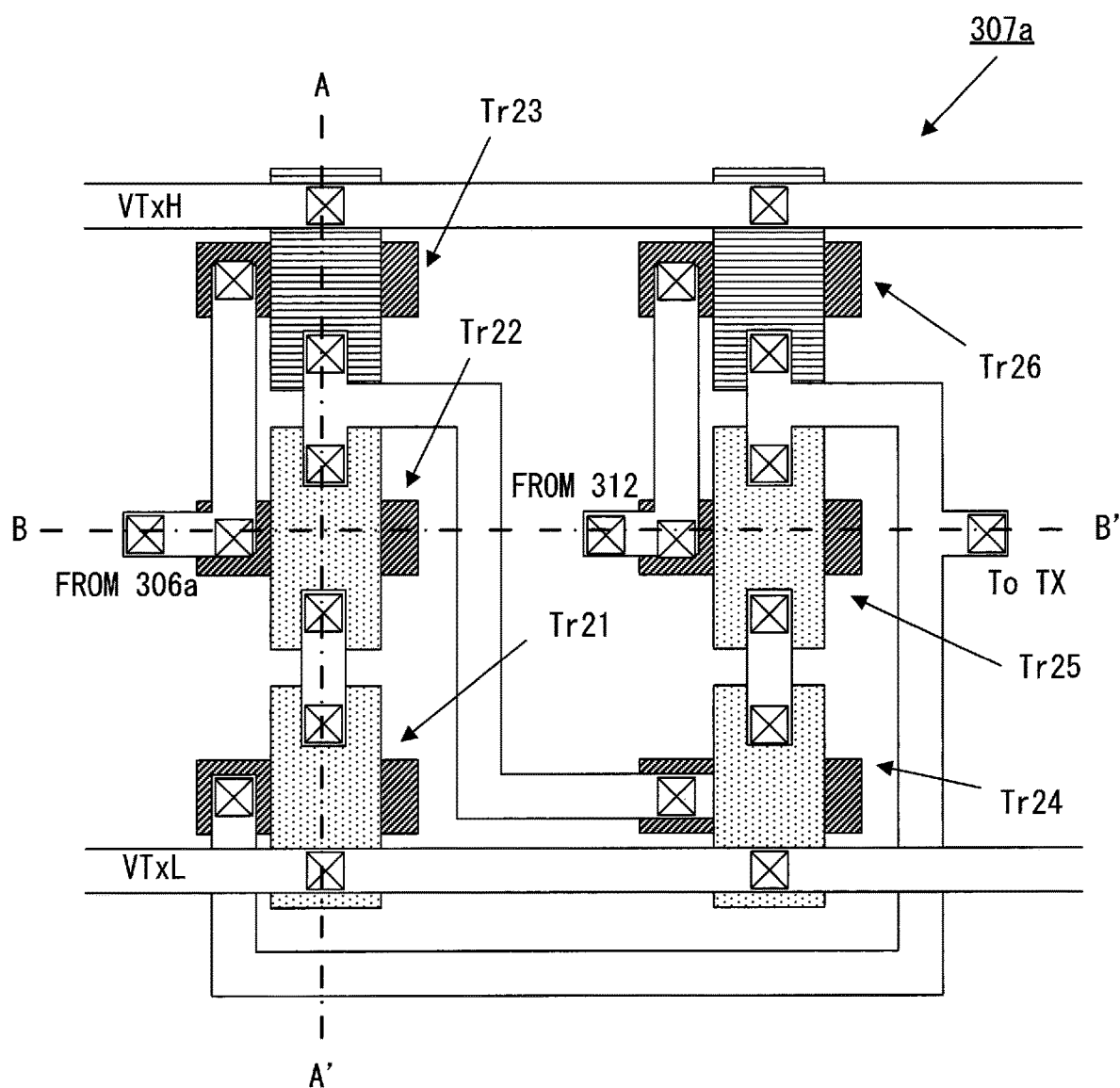
FIG. 8 is a plan view of the transfer signal supply unit.

FIG. 7 is a circuit diagram of the transfer signal supply unit 307a and FIG. 8 is a plan view of the transfer signal supply unit 307a. As illustrated in FIGS. 7 and 8, the transfer signal supply unit 307a according to this embodiment has an nMOS transistor Tr21, an nMOS transistor Tr22, a pMOS transistor Tr23, an nMOS transistor Tr24, an nMOS transistor Tr25, and a pMOS transistor Tr26. These transistors are thin-film transistors (TFTs). The pixel 30 according to this embodiment further has an inverter circuit 312.

The nMOS transistor Tr22 and the pMOS transistor Tr23 constitute a CMOS circuit. A predetermined power supply applies a voltage VTxH to a source of the pMOS transistor Tr23. A transfer control unit 306a supplies gates of the nMOS transistor Tr22 and the pMOS transistor Tr23 with a transfer control signal. A source of the nMOS transistor Tr22 is connected to a drain of the nMOS transistor Tr21. A predetermined power supply applies a voltage VTxL to a source of the nMOS transistor Tr21. The voltage VTxH is higher than the ground voltage which is the substrate voltage of the first semiconductor substrate 7 (i.e., the voltage VTxH is a positive voltage), while the voltage VTxL is lower than the ground voltage which is the substrate voltage of the first semiconductor substrate 7 (i.e., the voltage VTxL is a negative voltage).

The nMOS transistor Tr25 and the pMOS transistor Tr26 constitute a CMOS circuit. A predetermined power supply applies a voltage VTxH to a source of the pMOS transistor Tr26. The inverter circuit 312 supplies gates of the nMOS transistor Tr25 and the pMOS transistor Tr26 with a signal having high and low levels that are inverted with respect to those of the transfer control signal. A source of the nMOS transistor Tr25 is connected to a drain of the nMOS transistor Tr24. A predetermined power supply applies a voltage VTxL to a source of the nMOS transistor Tr24.

A gate of the nMOS transistor Tr24 is connected to drains of the nMOS transistor Tr22 and the pMOS transistor Tr23. A gate of the nMOS transistor Tr21 is connected to drains of the nMOS transistor Tr25 and the pMOS transistor Tr26. The transfer transistor Tx is supplied with voltages from the drains of the nMOS transistor Tr25 and the pMOS transistor Tr26 as transfer signals.

The transfer signal supply unit 307a configured in the above-described manner supplies the gate of the transfer transistor Tx with either the voltage VTxH which is higher than the substrate voltage of the first semiconductor substrate 7 or the voltage VTxL which is lower than the substrate voltage of the first semiconductor substrate 7, as the transfer signal, based on the output signal of the transfer control unit 306a. In other words, the circuit including the nMOS transistor Tr21, the nMOS transistor Tr22, the pMOS transistor Tr23, the nMOS transistor Tr24, the nMOS transistor Tr25, and the pMOS transistor Tr26 is a level shift circuit that converts the signal having the voltage VTxH and the ground voltage into the signal having the voltage VTxH and the voltage VTxL.

The inverter circuit 312 is a CMOS circuit including a pMOS transistor Tr28 and an nMOS transistor Tr27. The inverter circuit 312 is provided in the first semiconductor substrate 7. The inverter circuit 312 supplies a gate of the nMOS transistor Tr25 and a gate of the pMOS transistor Tr26 with either the voltage VDD and the ground voltage GND based on the output signal of the transfer control unit 306a.

FIG. 9(a) is a schematic view illustrating a cross section A-A' (FIG. 8) of the transfer signal supply unit 307a and FIG. 9(b) is a schematic view illustrating a cross section B-B' (FIG. 8) of the transfer signal supply unit 307a. The transfer signal supply unit 307a is formed in the insulating unit 9 provided between the first semiconductor substrate 7 and the second semiconductor substrate 8. Transmitting and receiving signals to and from the first semiconductor substrate 7 is performed through a bonding pad 90.

Figure 9:
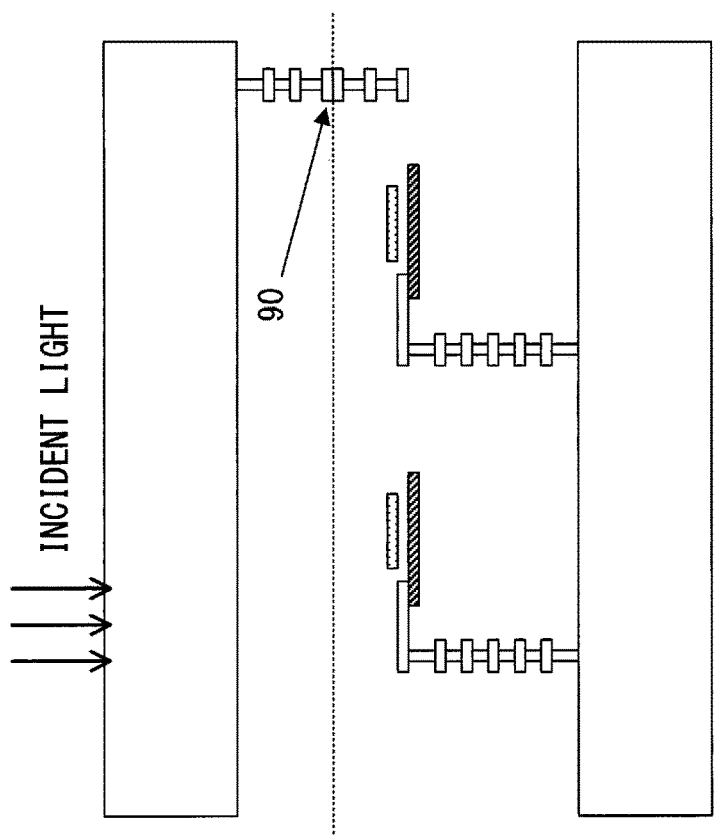
FIG. 9 is a view schematically illustrating a cross section of the transfer signal supply unit.
Figure 9:
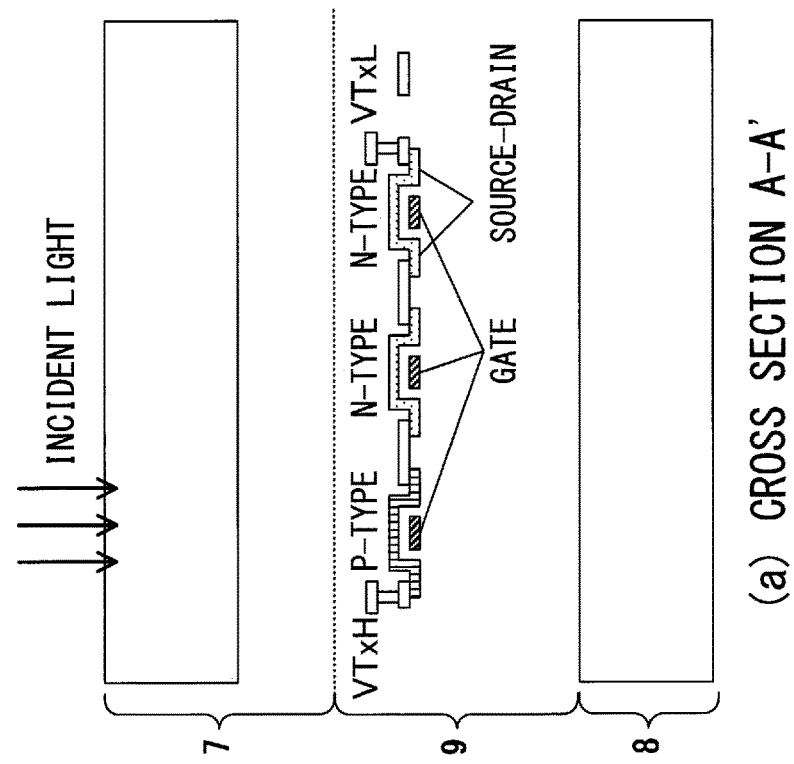

In FIG. 9, the transfer signal supply unit 307a is provided in the insulating unit 9. An insulating layer is formed at an interface between the insulating unit 9 and the second semiconductor substrate 8, and the transfer signal supply unit 307a is formed on the insulating layer.

In this way, the image sensor 3 in the present embodiment can control the exposure time for each pixel. In order to control the exposure time for each pixel, the timing of turning on and off the transfer transistor Tx must be controlled for each pixel. In other words, the voltage (in the present embodiment, the voltage VTxH and the voltage VTxL) to be supplied to the gate of the transfer transistor Tx must be controlled for each pixel. Accordingly, the supply unit for supplying the gate of the transfer transistor Tx with the voltages VTxH and VTxL must be provided for each pixel. Since the voltage handled by the first semiconductor substrate 7 is different from the voltage VTxH and the voltage VTxL, the supply units handling the voltages VTxH and VTxL would occupy a large area if they would be provided in the pixel 30. The supply unit supplying the voltage VTxL lower than the substrate voltage particularly requires a triple well structure to avoid a forward bias with respect to the substrate. The supply unit supplying the voltage VTxL therefore requires a particularly large area. As a result, an area occupied by the photodiode 31 in the pixel 30 would be substantially reduced. In other words, an fill factor of the photodiode 31 is substantially reduced, which makes miniaturization of the image sensor difficult. In the present embodiment, providing the transfer signal supply unit 307a in the insulating unit 9 allows the exposure time to be controlled for each pixel, without providing the supply unit handling the voltages VTxH and VTxL in the vicinity of the photodiode 31 of the first semiconductor substrate 7, i.e., without decreasing the fill factor of the photodiode 31.

According to the above-described embodiment, the following operational advantages can further be obtained, in addition to the operational advantage described in the first embodiment.

(7) The transfer signal supply unit 307a has a level shift circuit that converts the drive signal having the ground voltage and the voltage VTxH, which is higher than the ground voltage, into the transfer signal having the voltage VTxL and the voltage VTxH. In this way, the transfer signal supply unit 307a can supply the transfer transistor Tx with a signal having a voltage different from that of each circuit arranged in the first semiconductor substrate 7 and the second semiconductor substrate 8.

(8) The first semiconductor substrate 7 is provided with the inverter circuit 312 that outputs the signal supplied from the transfer control unit 306a to the level shift circuit. The level shift circuit includes six transistors Tr21 to Tr26. The level shift circuit outputs the voltage VTxL as the transfer signal if the signal supplied from the transfer control unit 306a is the ground voltage, and outputs the voltage VTxH as the transfer signal if the signal supplied from the transfer control unit 306a is the voltage VTxH. In this way, the transfer control unit 306a can supply the transfer transistor Tx with the voltage VTxL, without handling the voltage VTxL.

(9) The transfer signal supply unit 307a includes six transistors Tr21 to Tr26 which are thin-film transistors formed in the insulating layer 9 stacked on the first semiconductor substrate 7. This can form the first semiconductor substrate 7 as a bulk semiconductor substrate, which can lead to a decrease in manufacturing cost.

The following variations are also contemplated within the scope of the present invention, and one or more variations may be combined with the above embodiments.

First Variation

The level shift circuit described in the second embodiment may be added upstream of the transfer signal supply unit 307a described in the first embodiment. In other words, the level shift circuit may be inserted between the gate electrodes 331, 332 and the transfer control unit 306a illustrated in FIG. 5. In this way, it is not necessary to set a threshold voltage Vth of the nMOS transistor Tr1 to a relatively high voltage.

Second Variation

Although the transfer signal supply unit 307a is provided in the insulating layer provided on one surface of the second semiconductor substrate 8 in the second embodiment as illustrated in FIG. 9, the transfer signal supply unit 307a may be provided on the first semiconductor substrate 7 side. In this case, an insulating layer is formed on a surface of the first semiconductor substrate 7 that faces the second semiconductor substrate 8, and the transfer signal supply unit 307a is formed on the insulating layer.

While various embodiments and variations have been described above, the present invention is not limited to these. Other aspects contemplated within the technical idea of the present invention are also included within the scope of the present invention. The above embodiments and variations also include the following image sensor and electronic camera.

(1) An image sensor comprising: a first semiconductor layer provided with a pixel, including a photoelectric conversion unit that photoelectrically converts incident light to generate an electric charge, an accumulation unit that accumulates the electric charge generated by the photoelectric conversion unit, and a transfer unit that transfers the electric charge generated by the photoelectric conversion unit to the accumulation unit; a second semiconductor layer provided with a supply unit that supplies the transfer unit with a transfer signal for transferring the electric charge from the photoelectric conversion unit to the accumulation unit; and a third semiconductor layer into which a signal is inputted, the signal being based on the electric charge that has been transferred to the accumulation unit.

(2) The image sensor as described in (1), wherein: the second semiconductor layer has a thin-film transistor.

(3) The image sensor as described in (2), wherein: the first semiconductor layer and the third semiconductor layer are configured by semiconductor substrates.

(4) The image sensor as described in (2) or (3), wherein: the second semiconductor layer is arranged in an insulating unit provided between the semiconductor substrate constituting the first semiconductor layer and the semiconductor substrate constituting the third semiconductor layer.

(5) The image sensor as described in (1), wherein: the first semiconductor layer is one of a silicon substrate and a silicon layer of a SOI substrate having the silicon substrate, an embedded oxide layer, and the silicon layer, and the second semiconductor layer is the other of the silicon substrate and the silicon layer.

(6) The image sensor as described in (5), wherein: the third semiconductor layer is configured by a semiconductor substrate.

(7) The image sensor as described in any one of (1) to (6), wherein: the supply unit supplies the transfer signal for transferring the electric charge generated by the photoelectric conversion unit during a first period to the accumulation unit or supplies the transfer signal for transferring the electric charge generated by the photoelectric conversion unit during a second period to the accumulation unit, the second period having a length different from that of the first period.

(8) The image sensor as described in any one of (1) to (7), wherein: the supply unit comprises a first diffusion unit to which a voltage higher than a voltage of the first substrate layer is applied by a first power supply unit and a second diffusion unit to which a voltage lower than the voltage of the first substrate layer is applied by a second power supply unit, and the supply unit supplies the transfer unit with a first voltage based on the voltage applied by the first power supply unit and supplies the transfer unit with a second voltage based on the voltage applied by the second power supply unit.

(9) The image sensor as described in (8), wherein: the photoelectric conversion unit is a pinned photodiode; and the transfer unit transfers the electric charge generated by the photoelectric conversion unit to the accumulation unit if the transfer signal represents the first voltage, and does not transfer the electric charge generated by the photoelectric conversion unit to the accumulation unit if the transfer signal represents the second voltage.

(10) The image sensor as described in (9), wherein: the supply unit has a level shift circuit that converts the drive signal having a third voltage which is not less than a ground voltage and a fourth voltage which is not less than the ground voltage and higher than the third voltage, into the transfer signal having the first voltage and the second voltage.

(11) The image sensor as described in (10), further comprising: an inverter circuit that outputs the drive signal to the level shift circuit, wherein: the level shift circuit includes at least six transistors, and the level shift circuit outputs the transfer signal representing the first voltage if the drive signal is the third voltage and outputs the transfer signal representing the second voltage if the drive signal is the fourth voltage.

(12) The image sensor as described in any one of (1) to (11), wherein: the photoelectric conversion unit is provided on a surface of the first semiconductor layer onto which incident light is incident, and the transfer unit and the accumulation unit are provided on a surface of the first semiconductor layer on the second semiconductor layer side.

(13) An image sensor comprising: a first semiconductor layer provided with a pixel including a photoelectric conversion unit that photoelectrically converts incident light to generate an electric charge, an accumulation unit that accumulates the electric charge generated by the photoelectric conversion unit, and a transfer unit that transfers the electric charge generated by the photoelectric conversion unit to the accumulation unit; and a semiconductor layer that is arranged to be stacked on the first semiconductor substrate, in which a supply unit is provided for each of a plurality of the pixels, the supply unit supplying the transfer unit with a transfer signal for transferring the electric charge from the photoelectric conversion unit to the accumulation unit.

(14) An image sensor comprising: a first semiconductor substrate having an insulating unit formed therein, and having a preset predetermined substrate voltage; an photoelectric conversion unit that is provided in the first semiconductor substrate and photoelectrically converts incident light to generate an electric charge; a transfer unit that is provided in the first semiconductor substrate and transfers the electric charge generated by the photoelectric conversion unit to an accumulation unit based on a transfer signal; and a supply unit that is electrically insulated from the first semiconductor substrate by the insulating unit, the supply unit supplying the transfer unit with the transfer signal including a first positive signal voltage and a second negative signal voltage.

(15) An electronic camera having the image sensor according to any one of (1) to (14).

The above-described embodiments and variations further include the following image sensors.

(1) An image sensor comprising: a first semiconductor layer provided with a plurality of pixels, each pixel including a photoelectric conversion unit that photoelectrically converts incident light, an accumulation unit that accumulates an electric charge as a result of photoelectric conversion by the photoelectric conversion unit, and a transfer unit into which a transfer signal is inputted, the transfer signal having a first voltage higher than a ground voltage and a second voltage lower than a ground voltage; a second semiconductor layer provided with an A/D conversion unit for each of a plurality of the pixels, the A/D conversion outputting a digital signal based on an amount of the electric charge accumulated on the accumulation unit; and an insulating unit that is arranged between the first semiconductor substrate and the second semiconductor substrate, in which a transfer signal supply unit is provided for each of a plurality of the pixels, the transfer signal supply unit supplying the transfer unit with the transfer signal.

(2) The image sensor as described in (1), wherein: a part of transfer signal supply units each corresponding to the transfer signal supply unit transfer the electric charge generated by the photoelectric conversion unit during a first period to the accumulation unit and another part of the plurality of transfer signal supply units supply the transfer signal that transfers the electric charge generated by the photoelectric conversion unit during a second period to the accumulation unit, the second period having a length different from that of the first period.

(3) The image sensor as described in (1) or (2), wherein: the transfer signal supply unit comprises a first diffusion unit that receives a positive voltage from the first power supply unit for positive voltage and a second diffusion unit that receives a negative voltage from the second power supply unit for negative voltage, and the transfer signal supply unit supplies the transfer unit with the first voltage based on the positive voltage received by the first power supply unit and supplies the transfer unit with the second voltage based on the negative voltage received by the second power supply unit.

(4) The image sensor as described in any one of (1) to (3), wherein: the photoelectric conversion unit is a pinned photodiode; and the transfer unit transfers the electric charge as a result of photoelectric conversion by the photoelectric conversion unit to the accumulation unit if the transfer signal represents the first voltage, and does not transfer the electric charge as a result of photoelectric conversion by the photoelectric conversion unit to the accumulation unit if the transfer signal represents the second voltage.

(5) The image sensor as described in (4), wherein: the transfer signal supply unit has a level shift circuit that converts the drive signal having a third voltage which is not less than a ground voltage and a fourth voltage which is not less than the ground voltage and higher than the third voltage, into the transfer signal having the first voltage and the second voltage.

(6) The image sensor as described in (5), further comprising: an inverter circuit that outputs the drive signal to the level shift circuit, wherein: the level shift circuit includes at least six transistors, and the level shift circuit outputs the transfer signal representing the first voltage if the drive signal is the third voltage and outputs the transfer signal representing the second voltage if the drive signal is the fourth voltage.

(7) The image sensor as described in any one of (1) to (6), wherein: the photoelectric conversion unit is provided on a surface of the first semiconductor layer onto which incident light is incident, and the transfer unit and the accumulation unit are provided on a surface of the first semiconductor layer on the second semiconductor layer side.

(8) The image sensor as described in any one of (1) to (7), wherein: the first semiconductor substrate is a SOI substrate and the insulating unit includes an embedded insulating layer.

(9) The image sensor as described in any one of (1) to (8), wherein: the insulating unit includes an insulating layer stacked on the first semiconductor substrate or the second semiconductor substrate, and the transfer signal supply unit includes a thin-film transistor formed on the insulating layer.

(10) An image sensor comprising: a first semiconductor substrate having an insulating unit formed therein, and having a preset predetermined substrate voltage; an photoelectric conversion unit that is provided in the first semiconductor substrate and photoelectrically converts incident light; a transfer unit that is provided in the first semiconductor substrate and transfers the electric charge as a result of photoelectric conversion by the photoelectric conversion unit to an accumulation unit based on the transfer signal; and a supply unit that is electrically insulated from the first semiconductor substrate by the insulating unit, the supply unit supplying the transfer unit with the transfer signal including a first positive signal voltage and a second negative signal voltage.

The disclosure of the following priority application is herein incorporated by reference:

Japanese Patent Application No. 2015-195281 (filed Sep. 30, 2015)

REFERENCE SIGNS LIST

3 . . . image sensor, 7 . . . first semiconductor substrate, 8 . . . second semiconductor substrate, 9 . . . insulating unit, 30 . . . pixel, 31 . . . photodiode, 301 . . . analog circuit unit, 302 . . . A/D conversion unit, 303 . . . sampling unit, 306 . . . individual pixel control unit, 307 . . . pixel driving unit

The invention claimed is:

1. An image sensor comprising:
a first semiconductor layer provided with a pixel, including a photoelectric conversion unit that photoelectrically converts incident light to generate an electric charge, an accumulation unit that accumulates the electric charge generated by the photoelectric conversion unit, and a transfer unit that transfers the electric charge generated by the photoelectric conversion unit to the accumulation unit;
a second semiconductor layer provided with a supply unit that supplies the transfer unit with a transfer signal for transferring the electric charge from the photoelectric conversion unit to the accumulation unit; and
a third semiconductor layer into which a signal is inputted, the signal being based on the electric charge that has been transferred to the accumulation unit.

2. The image sensor according to claim 1, wherein:
the second semiconductor layer has a thin-film transistor.

3. The image sensor according to claim 2, wherein:
the first semiconductor layer and the third semiconductor layer are configured by semiconductor substrates.

4. The image sensor according to claim 2, wherein:
the second semiconductor layer is arranged in an insulating unit provided between a semiconductor substrate constituting the first semiconductor layer and a semiconductor substrate constituting the third semiconductor layer.

5. The image sensor according to claim 1, wherein:
the first semiconductor layer is one of a silicon substrate and a silicon layer of a SOI substrate having the silicon substrate, an embedded oxide layer, and the silicon layer, and the second semiconductor layer is the other of the silicon substrate and the silicon layer.

6. The image sensor according to claim 5, wherein:
the third semiconductor layer is configured by a semiconductor substrate.

7. The image sensor according to claim 1, wherein:
the supply unit supplies the transfer signal for transferring the electric charge generated by the photoelectric conversion unit during a first period to the accumulation unit or the transfer signal for transferring the electric charge generated by the photoelectric conversion unit during a second period to the accumulation unit, the second period having a length different from that of the first period.

8. The image sensor according to claim 1, wherein:
the supply unit comprises a first diffusion unit to which a voltage higher than a voltage of the first substrate layer is applied by a first power supply unit and a second diffusion unit to which a voltage lower than the voltage of the first substrate layer is applied by a second power supply unit, and the supply unit supplies the transfer unit with a first voltage based on the voltage applied by the first power supply unit and supplies the transfer unit with a second voltage based on the voltage applied by the second power supply unit.

9. The image sensor according to claim 8, wherein:
the photoelectric conversion unit is a pinned photodiode; and
the transfer unit transfers the electric charge generated by the photoelectric conversion unit to the accumulation unit if the transfer signal represents the first voltage, and does not transfer the electric charge generated by the photoelectric conversion unit to the accumulation unit if the transfer signal represents the second voltage.

10. The image sensor according to claim 9, wherein:
the supply unit has a level shift circuit that converts a drive signal having a third voltage which is not less than a ground voltage and a fourth voltage which is not less than the ground voltage and higher than the third voltage, into the transfer signal having the first voltage and the second voltage.

11. The image sensor according to claim 10, further comprising:
an inverter circuit that outputs the drive signal to the level shift circuit, wherein:
the level shift circuit includes at least six transistors, and the level shift circuit outputs the transfer signal representing the first voltage if the drive signal is the third voltage and outputs the transfer signal representing the second voltage if the drive signal is the fourth voltage.

12. The image sensor according to claim 1, wherein:
the photoelectric conversion unit is provided on a surface of the first semiconductor layer onto which incident light is incident, and the transfer unit and the accumulation unit are provided on a surface of the first semiconductor layer on the second semiconductor layer side.

13. An electronic camera having the image sensor according to claim 1.

14. An image sensor comprising:
a first semiconductor layer provided with a pixel including a photoelectric conversion unit that photoelectrically converts incident light to generate an electric charge, an accumulation unit that accumulates the electric charge generated by the photoelectric conversion unit, and a transfer unit that transfers the electric charge generated by the photoelectric conversion unit to the accumulation unit; and
a semiconductor layer that is arranged to be stacked on the first semiconductor substrate, in which a supply unit is provided, the supply unit supplying the transfer unit with a transfer signal for transferring the electric charge from the photoelectric conversion unit to the accumulation unit.

15. An image sensor comprising:
a first semiconductor substrate having an insulating unit formed therein and having a preset predetermined substrate voltage;
an photoelectric conversion unit that is provided in the first semiconductor substrate and photoelectrically converts incident light to generate an electric charge;
a transfer unit that is provided in the first semiconductor substrate and transfers the electric charge generated by the photoelectric conversion unit to an accumulation unit based on a transfer signal; and
a supply unit that is electrically insulated from the first semiconductor substrate by the insulating unit, the supply unit supplying the transfer unit with the transfer signal including a first positive signal voltage and a second negative signal voltage.

\* \* \* \* \*